United States Patent [19]

Goutzoulis et al.

[11] Patent Number: 4,950,882
[45] Date of Patent: Aug. 21, 1990

[54] OPTO-ELECTRICAL EXCLUSIVE OR LOGIC GATES

[75] Inventors: Anastasios P. Goutzoulis, Pittsburgh; David K. Davies, Churchill Borough, Allegheny County, both of Pa.

[73] Assignee: Westinghouse Electric Corp., Pittsburgh, Pa.

[21] Appl. No.: 380,967

[22] Filed: Jul. 17, 1989

[51] Int. Cl.⁵ ............................................. H01J 31/50
[52] U.S. Cl. .............................. 250/213 A; 377/102
[58] Field of Search .......................... 250/213 A, 227; 377/102; 364/822; 307/311, 471

[56] References Cited

U.S. PATENT DOCUMENTS

| | | | |
|---|---|---|---|
| 3,348,064 | 10/1967 | Powlus | 250/213 A |
| 4,504,974 | 3/1985 | Rademaker | 307/311 |
| 4,506,151 | 3/1985 | MacDonald et al. | 250/213 A |
| 4,712,089 | 12/1987 | Verber | |

Primary Examiner—David C. Nelms
Assistant Examiner—Khaled Shami
Attorney, Agent, or Firm—W. G. Sutcliff

[57] ABSTRACT

An opto-electronic XOR gate includes a pair of diode type light sources connected back to back in parallel by a pair of input leads to which first and second electronic logic signals are applied. With only one logic signal in the high state, one of the diode-type light sources is forward biased while the other is reverse biased. With both logic signals high or low neither diode-type light source emits. A two to one fiber optic combiner (FOC) provides a single optical output which is on only when only one electrical signal is high. If an electronic output is desired, a single photodetector converts the output of the FOC to an electronic logic signal. For performing the exclusive OR operation on optical input signals, a pair of photodetectors and buffer amplifiers and connected to the input leads. For 10 to 12 GHz switching speeds laser diodes are used as the diode-type light sources. When lower switching speeds are satisfactory, light emitting diodes can be used as the diode-type light sources.

16 Claims, 2 Drawing Sheets

OPTO-ELECTRICAL EXCLUSIVE OR LOGIC GATES

CROSS REFERENCE TO RELATED APPLICATION

Our commonly owned, concurrently filed United States patent application entitled "Pseudorandom Pulse Code Generators Using Electro-Optical XOR Gates" and identified by assignee's Ser. No. 07/380,959.

FIELD OF THE INVENTION

This invention relates to logic gates, and in particular to logic gates which perform the exclusive OR operation optically, either on optical or electrical input signals to produce either an optical or electrical output signal.

BACKGROUND

The exclusive OR (XOR) gate is a device frequently used in logic circuits. Such devices obey the rule that the output assumes a high state if one, and only one, input assumes a high state. Conventionally, such devices are implemented electronically by any one of several arrangements of AND and OR gates, typically three in number, each of which in turn comprises several electronic components. While such an electronic XOR gate can be implemented as an integrated circuit which is much more compact than a device using discrete AND and OR gates, the large number of electronic elements required still occupy considerable real estate. Furthermore, conventional electronic XOR gates are relatively slow with limiting speeds in the neighborhood of a few hundred megahertz. Galium arsenide technology has extended this range to 1 to 2 gigahertz.

There are applications such as pseudorandom (PN) code generators which utilize XOR gates where it would be desirable to operate at much higher speeds, such as tens of gigahertz. To our knowledge, there are presently no XOR gates available that can operate at such speeds. While it is well known that optical data processing systems operate well into the gigahertz range, there is no known optical OR gate available.

Accordingly, there is a need for an XOR gate that can operate at high speed, and preferably at speeds well above one gigahertz.

There is also a need for an optical XOR gate which could be used with optical logic circuits operating at any data rate.

There is an attendant need for such an XOR gate which is inexpensive, reliable and occupies minimal real estate.

There is a further need for such an XOR gate which could be implemented either with discrete components or as an integrated circuit.

There is an additional need for such an XOR gate which can operate with any combination of electrical and optical inputs and outputs.

SUMMARY OF THE INVENTION

These and other needs are satisfied by the invention which is directed to an opto-electrical exclusive OR (XOR) gate utilizing two diode-type light sources connected back to back with the anode of each diode-type light source connected to the cathode of the other in parallel by two input leads. With a high logic signal on one input lead and a low logic signal on the other, one of the diode type light sources is forward biased to emit light while the other is reverse biased With both inputs high or both low neither of the diode-type light sources is turned on.

A two to one fiber optic combiner gathers light emitted by both diode-type light sources to provide a single optical output representative of the exclusive OR function. If an electrical output is desired, a photodetector is added to convert the optical output of the fiber optic combiner to an electrical signal. If the applied logic signals are optical, photodetectors are added to generate the electrical signals applied by the input leads to the diode-type light sources. In this instance, buffer amplifiers are also provided to boost the amplitude of the electrical logic signals generated by the input photodiodes. For some applications, switches may be added to the input circuit to control operation of the optoelectrical XOR gate.

Preferably, the diode-type light sources are laser diodes. The novel optoelectric XOR gate of the invention implemented with such devices has the capability of operating at speeds of at least 10 to 12 gigahertz. In applications where such speeds are not required, light emitting diodes may be used as the diode-type light sources.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENT

Figure 1:
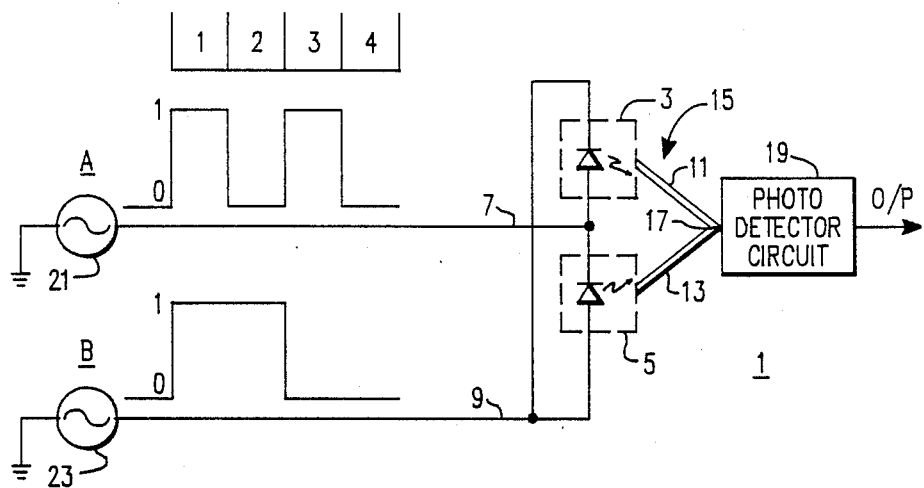
FIG. 1 is a schematic diagram of an XOR gate in accordance with the invention suitable for use with electronic input logic signals and which provides an electronic output signal.

FIG. 1 illustrates an XOR gate 1 in accordance with the invention in which first and second diode-type light sources, in this case laser diodes, 3 and 5, are electrically connected back to back, that is with the anode of each laser diode connected to the cathode of the other, in parallel, by first and second input leads 7 and 9. The optical output from each of laser diodes 3 and 5 is optically coupled into first and second optical fibers 11 and 13 of a fiber optic combiner 15 having a single output 17. Light from the output 17 of the fiber optic coupler 15 operates a photodetector 19 which generates an electronic output signal O/P.

Figures 2, 4:
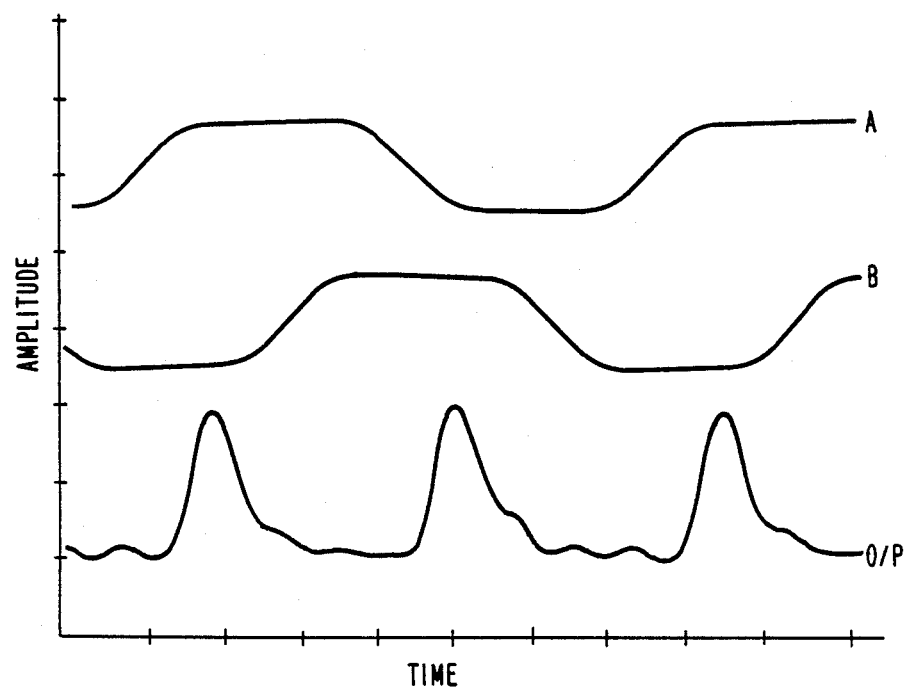
FIG. 2 is truth table for the XOR gate circuit of FIG. 1.
FIG. 4 is an oscilloscope plot illustrating the operation of the XOR gate illustrated in FIG. 1.

The XOR gate 1 of FIG. 1 performs the exclusive OR operation on electronic logic signals applied to the input leads 7 and 9. As shown in FIG. 1, a source A supplies input pulses to the lead 7 and a source B can be used to apply input pulses to the input lead 9. The operation of the XOR gate 1 of FIG. 1 can be understood from consideration of the output signal O/P derived from the gate as a result of the input signals A and B of different time durations as shown schematically in FIG. 1. These signals A and B can take two values, "0" corresponding to zero voltage and "1" corresponding to the operating voltage of the laser diodes 3 and 5. The output O/P from the detector 19 depends on the relative phases of the signals A and B. There are four possible relative phases as shown in FIG. 1. For A=B=1 (region 1) and A=B=0 (region 4), both laser diodes 3 and 5 are in a zero biased condition and, thus, the detector output is low or "0". For A=0 and B=1 (region 2) diode 5 is forward biased and therefore emits, causing the detector output O/P to be in the high or "1" state. At the same time, diode 3 is reversed biased and does not emit. Alternatively, for A=1 and B=0 (region 3) diode 5 is reversed biased and does not emit; however, diode 3 is now forward biased and emits, producing a high or "1" state at the output of detector 19. Thus, the conditions of (i) a high output state when either of the input states is high, and (ii) a low output state when the input states are both either high or low, clearly corresponds to the operations of an XOR gate. Operation of the XOR gate 1 is summarized in the Truth Table of FIG. 2. Since the laser diodes 3 and 5 are connected in a reverse fashion, they provide effective reverse bias protection for each other because whenever one of the diodes is subjected to a reverse bias condition, the other is forward biased, limiting the voltage drop to approximately two volts.

Figure 3:
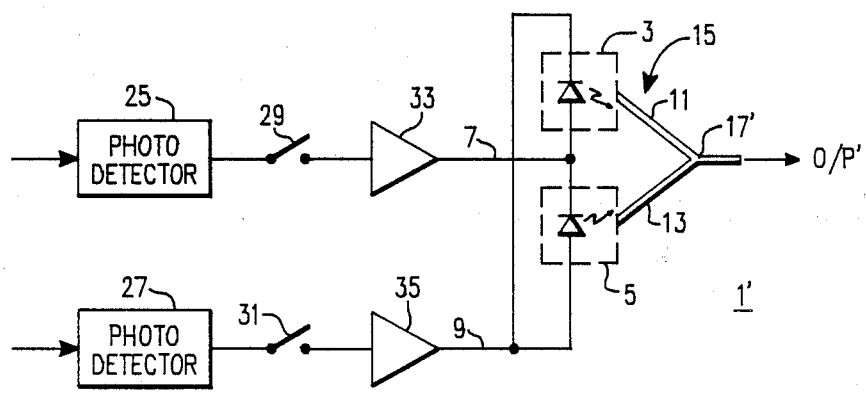
FIG. 3 is a schematic diagram of a modified form of the XOR gate circuit in accordance with the invention suitable for use with optical input logic signals and which generates an optical output signal.

FIG. 3 illustrates the XOR gate 1' of the invention modified to operate in response to optical input logic signals and to generate optical output logic signals. The optical output O/P' is achieved merely by eliminating the photodetector circuit 19 so that the output of the fiber optic combiner 15 becomes the output of the XOR gate 1'. Optical input logic signals A' and B' are converted to electronic signals by opto-electronic elements comprising input photodetectors 25 and 27 connected to the input leads 7 and 9 respectively through switches 29 and 31 and buffer amplifiers 33 and 35 respectively. The switches 29 and 31 permit the XOR circuit 1' to be selectively disabled. This feature is suitable for certain applications of the XOR circuit such as the encoders disclosed in our commonly owned concurrently filed U.S. patent application entitled "Pseudorandom Pulse Code Generators Using Electro-Optical XOR Gates" and identified by assignee's Ser. No. 07/380,959. The amplifiers 33 and 35 provide gain for the outputs of the photodetectors 25 and 31.

From FIGS. 1 and 3, it is obvious that the XOR gate of the invention can be arranged with any desired combination of optical or electronic inputs and outputs.

A prototype of the XOR gate of the invention with electronic inputs and outputs as shown in FIG. 1 was constructed of low cost Mitsubishi ML 4402 laser diodes for the diodes 3 and 5. These laser diodes have rise and fall times of about 300 and 450 picoseconds respectively. The LD's were prebiased to about five percent of their threshold current. A two to one fiber optic combiner 15 constructed from 50/125 $\mu$m fiber was used to couple the light output from the laser diodes to a Mitsubishi PD 1002 avalanche photodiode which can resolve pulses down to 300 picoseconds full width half maximum (FWHM). The two laser diodes were driven from a Hewlett-Packard 8082A pulse generator which has an output pulse FWHM of about 3.3 nanoseconds. The output of the generator was split into two channels and one channel was subjected to a two nanosecond delay. These two input signals are shown by the traces A and B in FIG. 4. No buffers were used and these signals A and B were applied directly to the two laser diodes 3 and 5. The optical output of the gate is shown in the trace O/P in FIG. 4. It can be seen that this output is consistent with the output of an XOR gate in accordance with the Truth Table of FIG. 2. The rise and fall times of the output signal where 300 picoseconds and 700 picoseconds, respectively, and the FWHM was about 850 picoseconds. It should be noted that the fall time is determined by the signal generator and not by the laser diodes. This data corresponds to about 1 Gbit/s RZ operation.

The ultimate speed of the XOR gate will be determined by the speed of the laser diodes which is determined by the laser diode parasitics (those which divert high-frequency components of the drive currents away from the laser diode). In practice, they take the form of a resistance in series with the laser diodes combined with shunt capacitance. The smallest resistance and capacitance values achieved so far have resulted in RC-limited laser diode operation in the 20-24 GHz range. In the XOR gate, the parallel connection of the two laser diodes increases the circuit's capacitance by a factor of two which implies that the speed will be reduced of a factor of two as well. This means that for the above laser diode speed figures, the XOR's speed will be restricted to about ten to twelve Gbit/s RZ.

Galium arsenide detectors operating at 25 gigahertz are commercially available for generating the electrical output for the gate of FIG. 1 and the electrical input for the gate of FIG. 3. Galium arsenide Schottky diodes detectors operating at 100 gigahertz have been demonstrated by others.

Where lower speed operations are acceptable, light emitting diodes (LEDs) may be used in place of the laser diodes. Switching speeds of the range in the range of 500 MHz to 1 GHz are achievable with the LEDs.

The XOR gate of the invention provides a speed of operation which is at least an order of magnitude greater than that of conventional electronic XOR gates and several times greater than electronic XOR gates employing galium arsenide technology. Furthermore, it is simpler and has fewer components, can provide isolation when used in a purely electronic circuit and requires less real estate. It is also adaptable for implementation as an integrated circuit.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. An opto-electronic XOR gate for performing the logical XOR operation on first and second electronic logic signals, said gate comprising:
first and second diode-type light sources each having a cathode and anode;
first and second input leads to which said first and second electronic logic signals are applied connecting said first and second diode type light sources back to back with the anode of each connected to the cathode of the other;
a fiber optic combiner having first and second inputs which gather light emitted from the first and second diode-type light sources respectively and a single output from which light from the first and second inputs is emitted; and a detector generating an electronic signal from light emitted from said output of the fiber optic combiner.

2. The gate from of claim 1 wherein said first and second diode-type light sources are laser diodes.

3. The gate of claim 1 wherein said first and second diode-type light sources are light emitting diodes.

4. The gate of claim 1 in combination with first and second opto-electrical elements connected to said first and second input leads respectively and generating said first and second electronic logic signals from optical logic signals.

5. The combination of claim 4 wherein said optoelectronic elements include detector means generating said electronic logic signals from said optical logic signals and amplifier means amplifying the electronic logic signals.

6. The combination of claim 5 wherein said opto-electronic elements also include switches selectively connecting said electronic logic signals to the first and second input leads respectively.

7. An opto-electronic XOR gate for performing the logical exclusive OR operation on first and second optical logic signals, said gate comprising:

first and second diode-type light sources each having an anode and a cathode;

first and second electrical lead means connecting said first and second diode-type light sources back to back in parallel with the anode of each diode-type light source connected to the cathode of the other diode-type light source;

first and second opto-electronic elements generating from said first and second optical logic signals, first and second electronic logic signals which are applied to said first and second electrical lead means; and a two to one optical combiner having first and second inputs gathering light emitted from said first and second diode-type light sources respectively, and a single output from which light from the first and second inputs is emitted.

8. The gate of claim 7 wherein said diode-type light sources are laser diodes.

9. The gate of claim 7 wherein said diode-type light sources are light emitting diodes.

10. The gate of claim 7 wherein said opto-electronic elements include switch means selectively applying said first and second electronic logic signals to said first and second electrical lead means.

11. The gate of claim 7 wherein said first and second opto-electronic elements comprise detector means generating said first and second electronic logic signals and amplifier means amplifying said first and second electronic signals.

12. The gate of claim 11 wherein said optoelectronic elements further include switch means selectively applying said first and second electronic logic signals to said first and second electrical lead means.

13. An opto-electronic XOR gate for performing logical exclusive OR function on first and second electronic logic signals each selectively having a low state and a high state, said gate comprising:

first and second input leads to which said first and second electronic logic signals are respectively applied; and opto-electronic light source means including two diode-type light sources connected with said first and second electrical input leads, and selectively generating an optical logic signal having a high state when only one of said first and second electronic logic signals has a high state and having a low state otherwise, and an optical combiner combining light emitted by said first and second diode type light sources to generate said optical logic signal.

14. The gate of claim 13 wherein said diode-type light sources each have a cathode and an anode and wherein said first and second electrical leads connect said diode-type light sources back to back with the anode of each connected to the cathode of the other.

15. The gate of claim 14 wherein said diode-type light sources are laser diodes.

16. The gate of claim 14 wherein said diode-type light sources are light emitting diodes.

* * * * *